(12) United States Patent
Dietzel et al.

(10) Patent No.: US 10,575,411 B2
(45) Date of Patent: Feb. 25, 2020

(54) METHOD OF PROVIDING CONDUCTIVE STRUCTURES IN A MULTI-FOIL SYSTEM AND MULTIFOIL SYSTEM COMPRISING SAME

(75) Inventors: Andreas Heinrich Dietzel, Kempen (DE); Jeroen van den Brand, Goirle (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 1453 days.

(21) Appl. No.: 13/001,024

(22) PCT Filed: Jul. 1, 2009

(86) PCT No.: PCT/NL2009/050389
§ 371 (c)(1),
(2), (4) Date: Apr. 13, 2011

(87) PCT Pub. No.: WO2010/002252
PCT Pub. Date: Jan. 7, 2010

(65) Prior Publication Data
US 2011/0180206 A1    Jul. 28, 2011

(30) Foreign Application Priority Data
Jul. 2, 2008 (EP) .................................. 08159522

(51) Int. Cl.
*H05K 3/36* (2006.01)
(52) U.S. Cl.
CPC ........ *H05K 3/361* (2013.01); *Y10T 156/1056* (2015.01)

(58) Field of Classification Search
CPC ... H05K 2201/058; H05K 2201/09727; H05K 2201/09845; H05K 2201/10977;
(Continued)

(56) References Cited

U.S. PATENT DOCUMENTS 6,103,135 A * 8/2000 Kusner et al. .................. 216/20
6,207,259 B1 * 3/2001 Iino et al. ..................... 428/209
(Continued)

FOREIGN PATENT DOCUMENTS

DE   10 2005 033 218 A1   1/2007
EP    1 890 524 A1        2/2008
(Continued)

OTHER PUBLICATIONS

Japanese Patent Office, Notice of Reasons for Rejection in Japanese Application No. JP2011-516187 dated Feb. 9, 2016 (dated Feb. 16, 2016).

*Primary Examiner* — John L Goff, II
(74) *Attorney, Agent, or Firm* — Leydig, Voit & Mayer, Ltd.

(57) ABSTRACT

According to one aspect, the invention provides a method of providing conductive structures between two foils in a multi-foil system. The system comprises at least two foils, from which at least one foil comprises a terminal. The method comprises the steps of (in any order) providing at least one solid state adhesive layer, patterning adhesive layer with through-holes; filling the through-holes with conductive material, so as to form the conductive structure, connected to the terminal; and bonding the at least two foils. One advantage of the invention is that it may be used in a manufacturing process for multi-foil systems.

16 Claims, 8 Drawing Sheets

(58) Field of Classification Search
CPC .......... H05K 2203/063; H05K 3/0035; H05K
3/321; H05K 3/361; H05K 3/4069; H05K
3/4614; H05K 3/4617; H05K 3/462;
Y10T 156/1056; H01L 25/167; H01L
27/3227; H01L 27/288; H01L 2251/5338
USPC ............ 156/248, 252, 423; 174/264; 385/14
See application file for complete search history.

(56) References Cited

U.S. PATENT DOCUMENTS

| | | | |
|---|---|---|---|
| 6,351,031 B1* | 2/2002 | Iijima et al. .................. | 257/698 |
| 7,014,727 B2 | 3/2006 | Wargo et al. | |
| 2002/0016018 A1 | 2/2002 | Oka et al. | |
| 2002/0134584 A1* | 9/2002 | Higuchi et al. .............. | 174/264 |
| 2003/0013234 A1* | 1/2003 | Bregante ................. | H01L 21/52 |
| | | | 438/127 |
| 2004/0052945 A1* | 3/2004 | Curcio ................... | H05K 3/462 |
| | | | 427/271 |
| 2004/0148770 A1 | 8/2004 | Tsukamoto et al. | |
| 2004/0216916 A1* | 11/2004 | Wyrzykowska ....... | H05K 1/112 |
| | | | 174/255 |
| 2005/0028925 A1* | 2/2005 | Fernandes ............. | B29B 15/122 |
| | | | 156/269 |
| 2005/0155792 A1* | 7/2005 | Ito et al. ...................... | 174/264 |
| 2007/0113961 A1* | 5/2007 | Yamuchi ............. | B32B 37/1284 |
| | | | 156/235 |
| 2007/0246254 A1* | 10/2007 | Kumar ................. | H05K 3/4614 |
| | | | 174/264 |

FOREIGN PATENT DOCUMENTS

| | | | | |
|---|---|---|---|---|
| JP | 06-021619 A | 1/1994 | | |
| JP | H08-37375 A | 2/1996 | | |
| JP | H09-148739 A | 6/1997 | | |
| JP | H09-219590 A | 8/1997 | | |
| JP | 2001-160684 A | 6/2001 | | |
| JP | 2003-188536 A | 7/2003 | | |
| JP | 2004-311909 A | 11/2004 | | |
| WO | WO 2005/010930 A2 | 2/2005 | | |
| WO | WO-2007013001 A2 * | 2/2007 | ......... | H01L 51/5203 |
| WO | WO 2007/052584 A1 | 5/2007 | | |

* cited by examiner

METHOD OF PROVIDING CONDUCTIVE STRUCTURES IN A MULTI-FOIL SYSTEM AND MULTIFOIL SYSTEM COMPRISING SAME

CROSS-REFERENCES TO RELATED APPLICATIONS

This application is a National Stage of International Application No. PCT/NL2009/050389, filed Jul. 1, 2009, and which claims the benefit of European Patent Application No. 08159522.5, filed Jul. 2, 2008, the disclosures of which are incorporated herein by reference.

The invention relates to a method and a system for manufacturing multi-foil systems, and more particularly the mechanical assembly of foils that have an electric function.

DESCRIPTION OF PRIOR ART

The present invention relates to the field of mechanically assembling multi-foil systems, i.e. flexible laminated electronic or optic systems. In a particular type of these multi-foil systems, the so-called 'systems-in-foil', each foil may have a certain electric or optic function, like a display function, a battery function or a solar panel function. Systems-in-foil have numerous applications, e.g. in the fields of lighting and reusable and disposable sensor devices.

The individual foils may be made in large sizes and quantities at low costs, e.g. using production processes such as presently used in the paper printing industry. The individual foils may be manufactured on different locations and the system may be assembled on a central location.

A conventional method of bonding and electrically connecting foils is to use an anisotropic conductive adhesive over the whole surface of the foil. A disadvantage of this technique is that it is too expensive for low cost applications. Another conventional method might be to co-apply liquid conductive adhesive and liquid non-conductive adhesive for example by screen printing. A disadvantage is that intermixing of the liquid adhesives might occur when laminating.

In one aspect the invention aims to provide a method of bonding and electrically or optically connecting foils that may be used in a manufacturing process for multi-foil systems.

DISCLOSURE OF THE INVENTION

According to one aspect, the invention provides a method of providing conductive structures between two foils in a multi-foil system comprising at least two foils, at least one foil comprising a terminal, comprising the steps of, in any order, providing at least one solid state adhesive layer on a foil; patterning the adhesive layer with through-holes; filling the through-holes with conductive material, so as to form the conductive structure, connected to the terminal; and bonding the at least two foils.

According to another aspect, the invention provides a multi-foil system, comprising at least two foils, at least one foil comprising a terminal; at least one solid state adhesive layer between each two foils for bonding the foils, characterized in that a conductive structure is present between two foils, connected to the terminal, said conductive structure comprising conductive material being filled into through-holes in the adhesive layer.

According to yet another aspect, the invention provides a multi-foil manufacturing system, comprising at least one foil feed, arranged to provide a foil with at least one terminal; an adhesive patterning unit, arranged to provide a pattern of through-holes in a solid state adhesive layer; an alignment unit, arranged to align the terminal in the foil and the through-holes in the adhesive layer and a filling unit, arranged to fill the through-holes with a conductive material, so as to form a conductive structure between two foils.

The present invention will become more readily apparent from the following detailed description of the preferred embodiments of the present invention taken in conjunction with the accompanying drawings.

DESCRIPTION OF THE EMBODIMENTS

The invention concerns a method of providing conductive structures between two foils in a multi-foil system. The so-called functional foils that may be used in multi-foil systems according to the invention may be indicatively characterized as 'a flexible laminated electronic or optic foil system'. Typically, such a functional foil system comprises at least one functional circuit. Further, typically, the functional foil system comprises at least one connection patch being connected to the at least one functional circuit. Thus, a functional foil may be considered a multi-layer device in itself.

Typical examples of such foils can be found in the following prior art publication:

1. M. Koetse et al., 'An in-plane optical sensor', Proceedings of SPIE—The International Society for Optical Engineering, vol. 6739, 2007, and In the remainder, functional foils are generally referenced as 'foil'.

According to the present invention, the method comprises the steps of, in any order, providing at least one solid state adhesive layer on a foil; patterning the adhesive layer with through-holes; filling the through-holes with conductive material, so as to form the conductive structure, connected to the terminal; and bonding the at least two foils. The method may be used for manufacturing foil systems of different types. To elucidate various aspects of the method, in the following, several foil systems will be described. In the figures, similar parts will receive corresponding reference numerals.

FIG. 1 shows an embodiment of a foil system wherein the conductive structure (1) is formed between two foils (2), bonded by one solid state adhesive layer (5). However, the method may be used for creating foil systems with more than two foils (2), e.g. three, as will be described in a further embodiment. Also more than one adhesive layer may be used between two foils (2). This is shown in a further embodiment too.

Figure 1A:
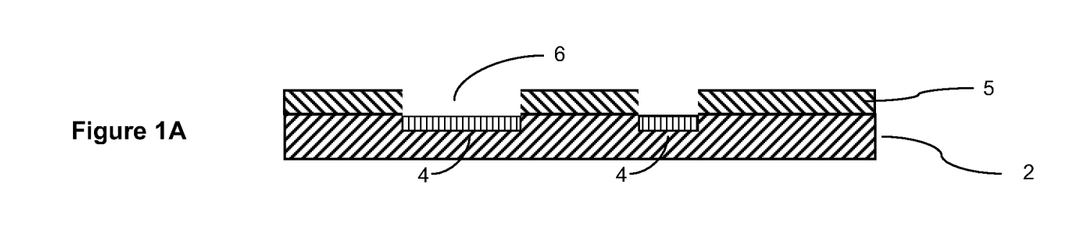
FIG. 1: Embodiment of the invention in the form of a two foil system.

FIG. 1A shows a patterned solid state adhesive layer (5) provided on a foil (2) with two terminals (4). The terminals (4) may be electrically or optically conductive interfoil connection patches and are located on the foils (2) to enable connecting foils with various functionalities. The terminals (4) may have sizes ranging for example from 100 square micrometers to one square millimeter. As long as a system comprises at least one foil (2) comprising at least one terminal (4), the number of terminals (4) may be varied.

Examples of adhesives that may be used to form the solid state adhesive layer are epoxies and acrylates, but also thermoplastic polymers like ethylene-vinyl acetate (EVA) and modified polypropylenes. The thermoplastic polymers include pressure sensitive adhesives, thermo hardening adhesives and thermoplastic materials. The thickness of the adhesive layer (5) may vary in the order of 5-50 micrometers.

Besides bonding the foils, the adhesive layer may perform several other functions in the multi-foil system.

The adhesive layer may act as a buffer layer to reduce the stresses in the system caused by mechanical deformations of the foils. The elasticity modulus of the adhesive layer may be chosen such that mechanical deformations are restricted in order to prevent system failure.

As explained above, a functional foil may be considered a multi-layer system in itself. This is advantageous in that foils may be designed for very diverse functionalities. On the other hand, different internal structures or, in other words different internal layer stacks, may result in different surface structures. Examples of foils with different surface structures are OLED foils or photodiode foils. Different surface structures may prevent the foils to be melted onto each other directly. In this case, the adhesive layer may separate the foils and enables to stack two functional foils having mutually differing adjacent surface structures. Another cause for different surface structures may be a layer that is applied to a foil only locally. For example to protect OLED's against the environment, the OLED foil may be locally covered by flexible, inorganic transparent barrier layers.

The functionality of an adhesive may be enriched by providing additives to the adhesive. Optical diffuser materials may for example be added to the adhesive to improve the light guiding characteristics of the adhesive layer, e.g. to ensure a good incoupling of light from an OLED foil onto a photodiode foil. Another example of enriching an adhesive layer is by mixing water getters through the adhesive to keep water away from water-sensitive foils, like OLED foils.

The adhesive may also provide mechanical integrity to a multi-foil system. Melting foils together directly may provide insufficient coherence between the foils and cause the foil system to fall apart. An adhesive layer may provide the coherence to keep the foil system together.

Figure 1B:
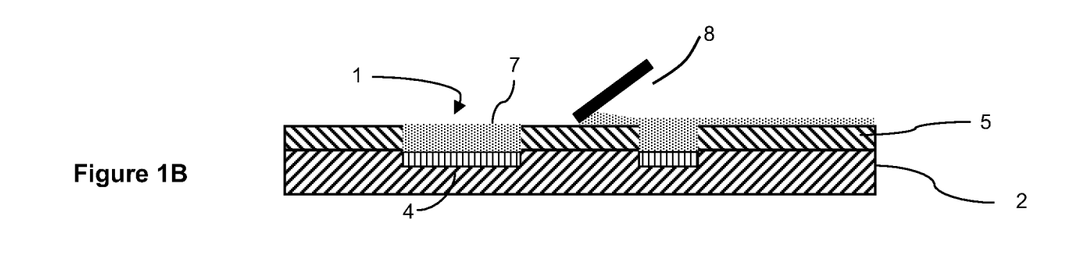

In FIG. 1B is shown that the through-holes (6) are filled with a conductive material (7), so as to form the conductive structure (1) connected to the terminal (4). The filling may be done with a dispenser or by applying other filling techniques. The filling needs to be done very accurately because overspill of conductive material (7) outside the holes (6) may decrease the strength of the adhesive layer (5). A release liner (9) may be used to overcome this problem. When using a release liner (9, see FIG. 6), not much filling accuracy is needed because any overspill is removed by the removal of the release liner (9). In this case, a squeegee (8) may be used for filling the holes. The use of a release liner (9) will later be described in more detail.

It is noted that in publication US2002016018, a method of producing a multi-layer printed wiring board is shown, wherein plural layers of adhesive uncured resin sheet are adhered to the inner base plate of the board. Subsequently, holes are formed in the uncured resin, which are filled with a conductive material. US'018 does not discuss sheet bonding, or providing interconnects between sheets. In another aspect, the challenges in manufacturing a flexible multi-foil system significantly differ from the manufacturing of a multi-layer printed wiring board.

Examples of the conductive material that may be used are conductive pastes like thermally or UV curing silver or copper, but also carbon-filled epoxies or acrylates. Additionally, it is possible to fill the holes with a seed-material and (electroless) grow metallic conductors from that seed.

Figure 1C:
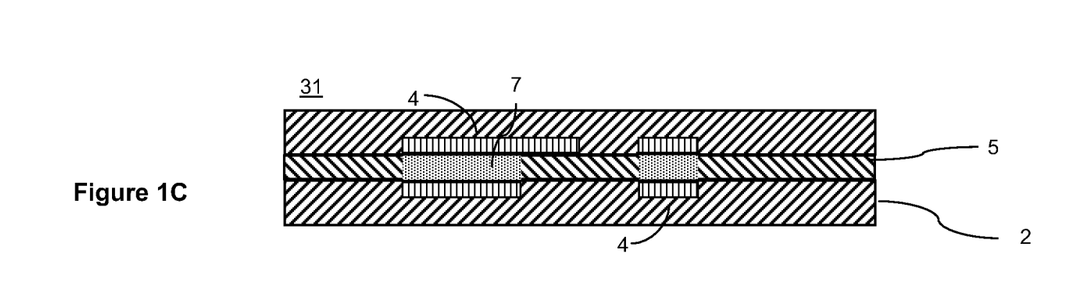

In FIG. 1C, the completed foil system (31) is shown, wherein a top foil (2) is bonded to the bottom foil (2).

When the conductive structure (1) connects two (or more) corresponding terminals (4) in at least two foils (2), an interconnect is formed. Depending on the type of conductive material (7) used for filling the holes (6), the conductive structure (1) may form an electrical interconnect or an optical interconnect.

The conductive structures in the embodiments described herein, merely concern electrical or optical interconnects. However, it is easily seen that the invention may also be used with electrical or optical circuits.

In this embodiment, the adhesive covers the whole foil (2), but it is also contemplated, e.g. from a cost point of view to provide the adhesive layer (5) only on a partially over the foil (2).

Since the steps of the method of the present invention may be executed in any order, the solid state adhesive layer may be patterned before or after the adhesive layer has been provided on the foil. This leads to manufacturing alternatives, some of which will be described in the following.

Figure 2A:
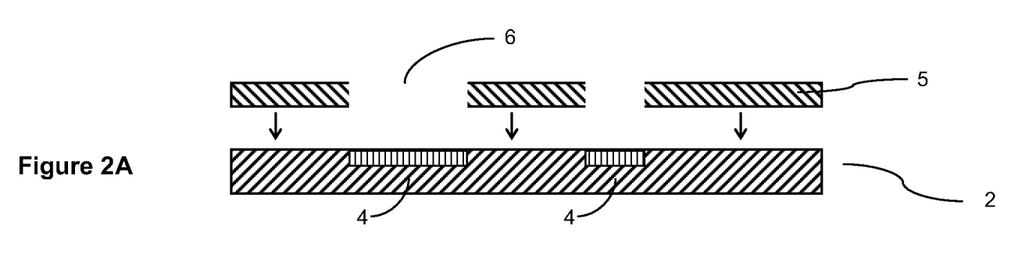
FIG. 2: Schematic representation of patterning alternatives.

In one alternative, shown in FIG. 2A, a solid state adhesive layer (5) patterned with through-holes (6) is provided on a foil (2). The patterning may be done by the manufacturer using the method of the present invention, but it is also contemplated that a pre-patterned adhesive layer (5) is used, manufactured by a third party. An advantage of laminating a pre-patterned adhesive layer to the foil is that the patterning process may be less complex because the foil will not be damaged by patterning the adhesive.

Figure 2B:
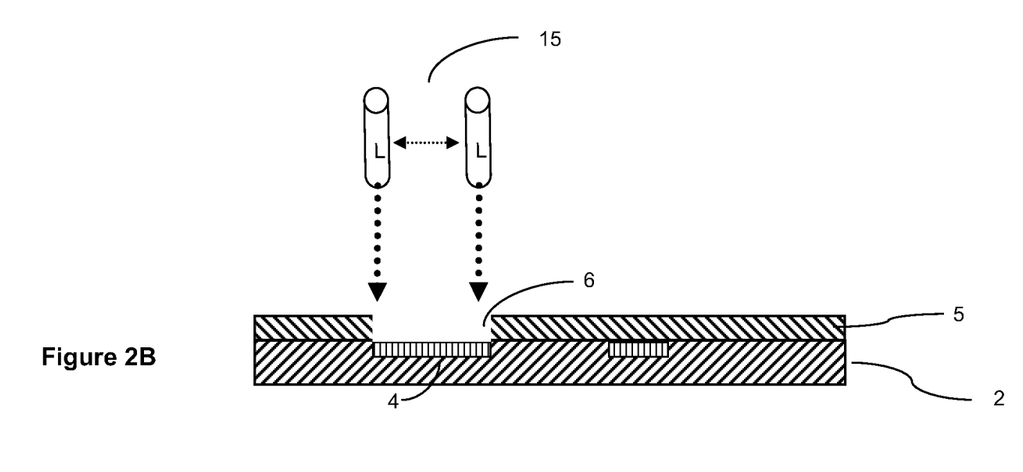

Another alternative is to pattern the adhesive layer (5) while the adhesive layer (5) is already provided on the foil (2). This is shown in FIG. 2B. An advantage of laminating before patterning is that providing an unpatterned adhesive layer hardly needs alignment compared to providing a patterned adhesive layer. The adhesive layer may be patterned very accurately after providing it to the foil.

In FIG. 2B, patterning the adhesive layer (5) is done by laser (15). However, other patterning techniques like punching and embossing are possible. These techniques are suitable for both patterning an adhesive layer already provided to the foil and for patterning an adhesive layer before providing it to the foil.

Figure 3A:
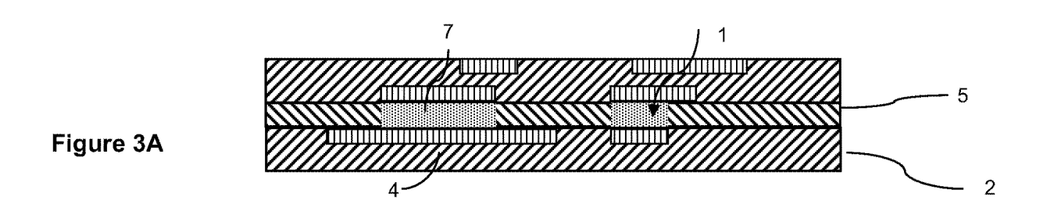
FIG. 3: Embodiment of the invention in the form of a three foil system.
Figure 3B:
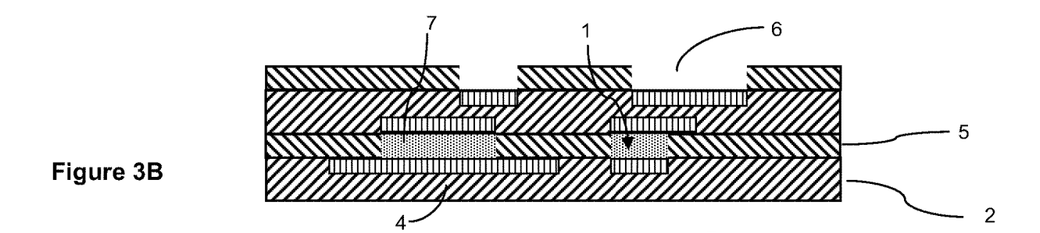
Figure 3C:
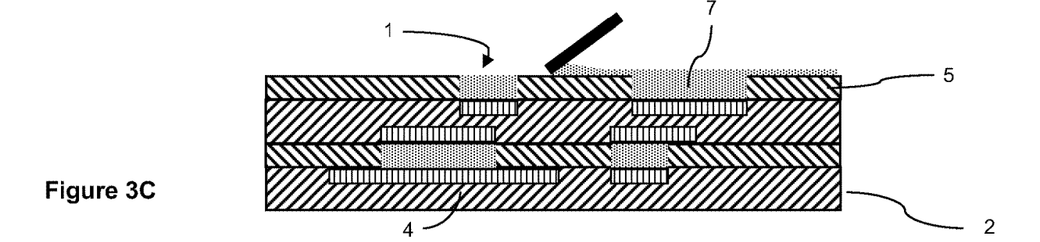
Figure 3D:
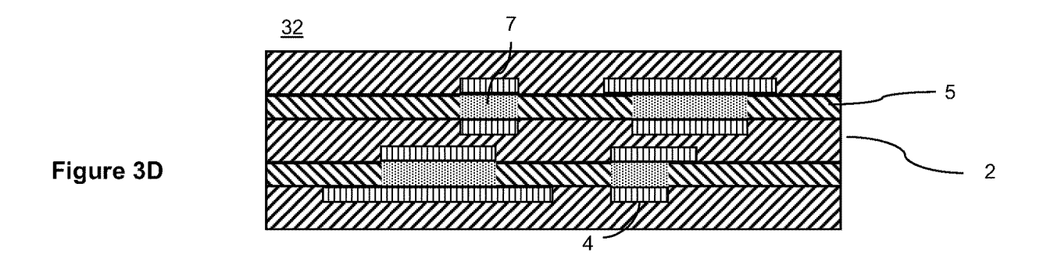

Another embodiment, shown in FIG. 3, shows the manufacturing of a multi-foil system (32) comprising three foils (2). Each two foils (2) are bonded by a single solid adhesive layer (5), comprising a conductive structure (1). FIG. 3A shows a two foil system, similar to the system of the previous embodiment, but comprising two more terminals (4) at the upper side of the top foil (2). These terminals (4)

will be connected to terminals (4) in a third foil (2). In FIG. 3B, a patterned adhesive layer (5) on top of the two foil system is shown. As described above, the patterning may be done before or after laminating the adhesive layer to the foil. FIG. 3C shows the filling of the holes (6) in the adhesive layer (5) with a conductive material (7). In FIG. 3D, the finished three foil system (33) is shown.

Figure 4A:
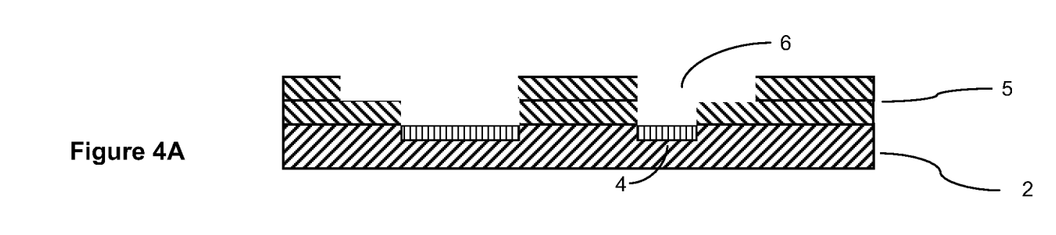
FIG. 4: Embodiment of the invention, wherein two adhesive layers are provided in a two foil system.
Figure 4B:
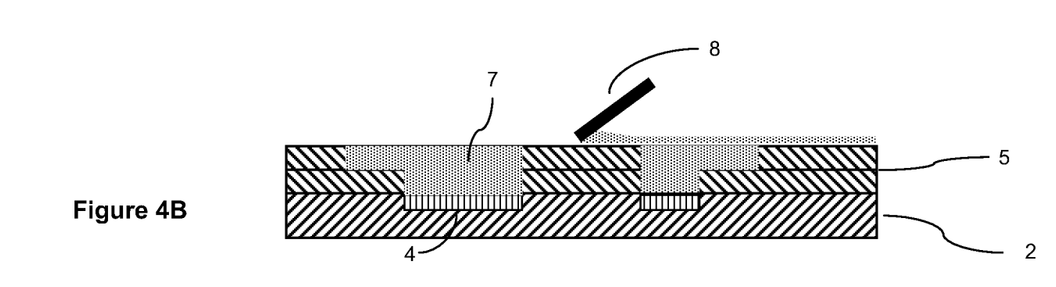
Figure 4C:
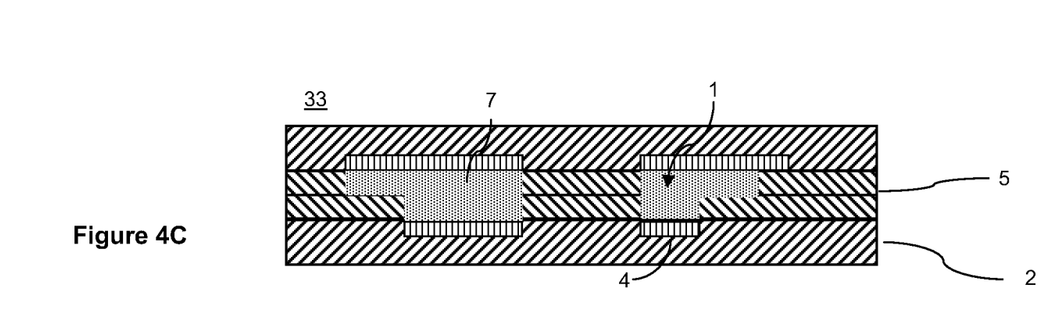
Figure 5A:
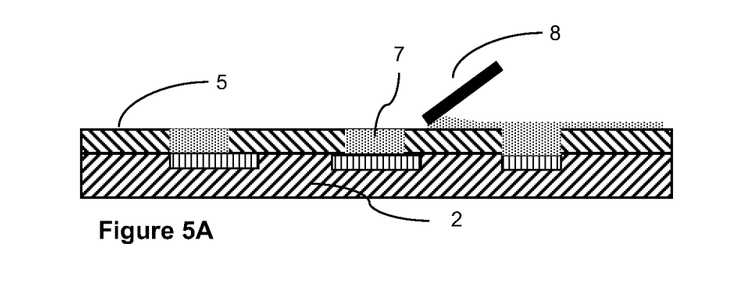
FIG. 5: Embodiment of the invention comprising a patterned foil.
Figure 5B:
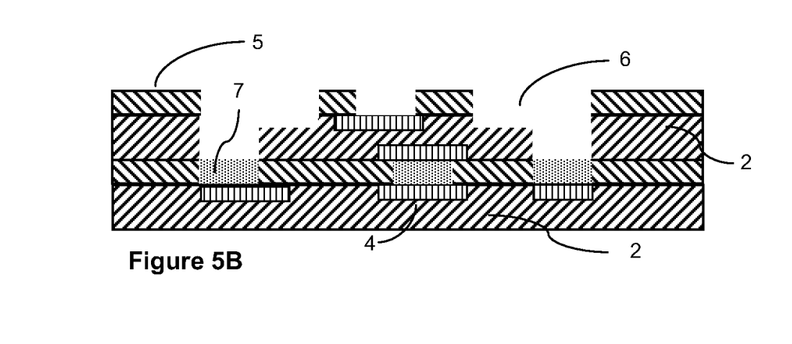
Figure 5C:
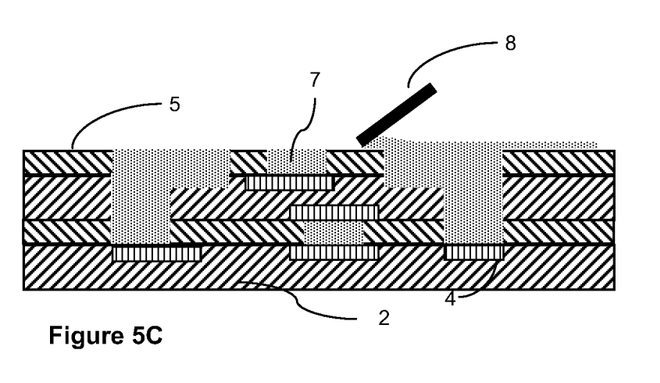
Figure 5D:
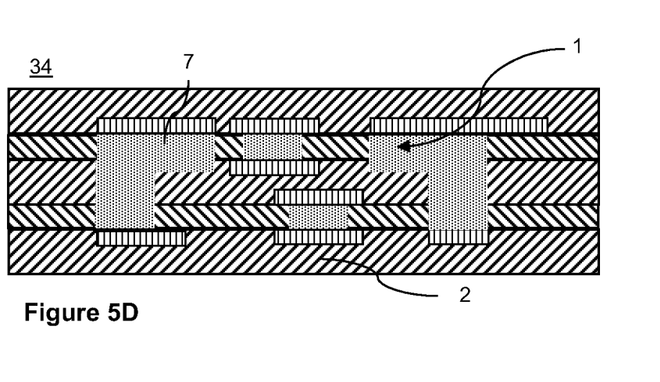
Figure 6A:
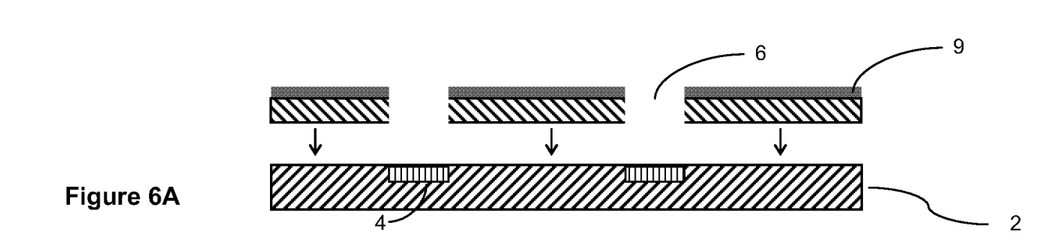
FIG. 6: Schematic representation of the use of a release liner.
Figure 6B:
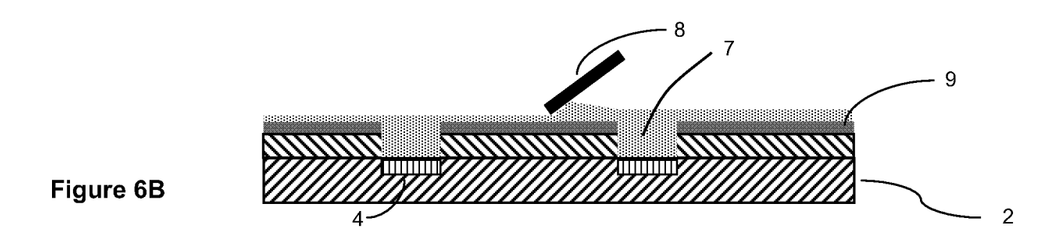
Figure 6C:
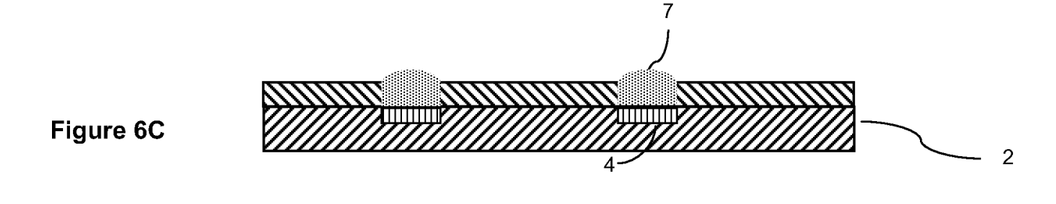
Figure 6D:
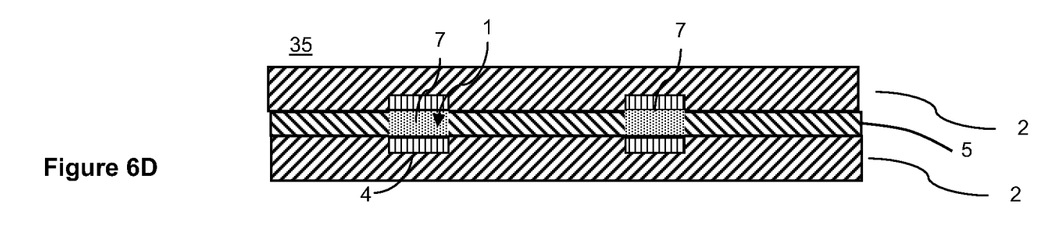

FIG. 4 shows a two foil system (33) that differs from the system shown in FIG. 1 in that two layers of conductive material (7) are provided between two foils (2). FIG. 4A shows two adhesive layers (5) provided on a bottom foil. As described above, the patterning may be done before or after laminating the adhesive layer to the foils. An alternative for providing two layers is the use of one layer with the same thickness as the two separate layers together. This layer then has to be patterned with holes (6) shaped as the superposition of the holes (6) of the two separate layers. The next step (FIG. 4B) is to fill the holes (6) formed by the two layers with conductive material (7). FIG. 4C shows the finished two foil system (34) including the top foil (2).

In the above, patterning of adhesive layers was described. As will be clear from the following embodiment, also foils may be patterned. The alternatives, techniques and advantages as described for adhesive layers are also relevant for patterning foils.

Yet another embodiment is shown in FIG. 5. It is a three foil system (34), wherein each two foils (2) are bonded by an adhesive layer (5). FIG. 5A shows the filling of the first adhesive layer (5), provided on the bottom foil (2). After filling, a second foil (2) and subsequently a second adhesive layer (5) are provided (shown in FIG. 5B). In this embodiment, the second foil (2) is patterned with through-holes (6). It is noted that typically foils are sensitive to patterning via-holes in the foils. Patterning holes may lead to foil failure if not correctly dealt with. To prevent foil failure, patterning holes in foils is preferably restricted to certain areas outside the functional circuits in the foil. An alternative to providing a patterned foil (2) first and an adhesive layer (5) next, is providing the foil (2) and the adhesive as one layer, which may be laminated previously. As described above, the patterning may be done before or after laminating the adhesive layer to the foils. Also the patterning of the foil may be done before or after providing the foil to the adhesive layer. The same arguments that have been described above for patterning adhesive layers may be applied to patterning foils. In FIG. 5C, the holes (6) in the foil and in the adhesive layer are filled and FIG. 5D shows the resulting three foil system (34) with the top foil (2) provided on top of the system.

Note that the three foil system (35) in this embodiment comprises four interconnects: two between the bottom foil (2) and the top foil (2), one between the bottom foil (2) and the middle foil (2) and one between the middle foil (2) and the top foil (2).

Further note that, as a result of creating interconnects through one or more foils (2), the patterning of the foils (2) at least partly overlaps the patterning of the adhesive layers (5).

It is remarked that combinations of the embodiments as described above fall within the scope of the claims. E.g. a three foil system with through-holes (6) provided in the middle foil (2) and wherein the lower and the middle foil (2) are bonded by two adhesive layers (5).

The step of filling the holes (6) in the adhesive layer (5), as described in the above needs an accurate, patterned filling technique to reduce overspill of conductive material (7) and prevent deterioration of the strength of the adhesive layer (5) in the area of overspill. Drawbacks of applying a patterned filling technique are complexity and costs.

One way to avoid the patterned filling of the holes (6) is to laminate a release liner (9, see FIG. 6) to the adhesive layer (5). Filling the holes (6) may then be done in a non-patterned, cheap way, e.g. with a squeegee (8). Removing the release liner (9) after filling the through-holes (6) with conductive material (7) and before bonding the foils (2) will remove the excess of conductive material (7).

FIG. 6 schematically shows the use of a release liner (9). In FIG. 6A, a patterned adhesive layer (5) with a release liner (9) laminated thereon, is provided to a foil (2). In FIG. 6B, the excess conductive material (7) on the release liner (9) after filling the holes (6) is clearly seen. After removal of the release liner (9), the excess material is removed too and the strength of the adhesive will be preserved. Another effect of using a release liner (9) can be seen in FIG. 6C. After removing the release liner (9), small heaps of conductive material (7) are formed on top of the filled holes (6). When providing the top foil (2) to the system (35), shown in FIG. 6D, the heaps of material are compressed into the holes (6), thereby increasing the density of the conductive material (7) and improving the conductivity. Yet another advantage of using a release liner is that the heaps of conductive material may compensate possible shrinkage of the conductive material. In FIG. 6D, the increase of density is indicated by a denser pointed fill effect. The thickness of the release liner (9) is in the order of 5-50 micrometers.

In the embodiment above, the release liner (9) is provided on the filling side of the adhesive layer (5) only. In practice, a release liner (9) may also be used on the side of the adhesive layer (5) opposite the filling side, i.e. the side that will be adhered to the foil (2). Before adhering the adhesive layer (5) to the foil (2), the release liner (9) is removed to reveal a pre-sticking side of the solid adhesive layer (5). Protecting the pre-sticking layer of the adhesive layer (5) may simplify the handling of the adhesive layer (5) during the manufacturing of multi-foil systems.

Figure 7:
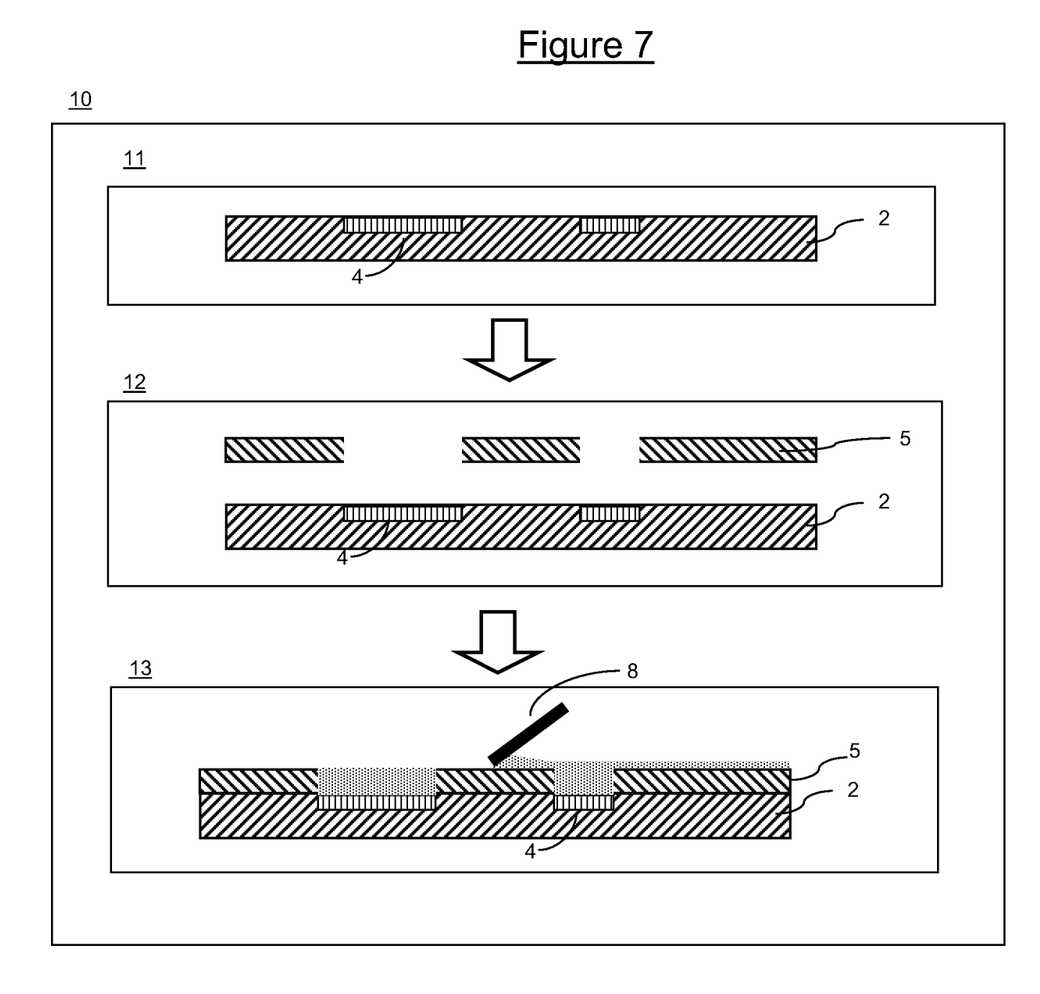
FIG. 7: Schematic representation of a multi-foil manufacturing system.

The method of the present invention may be used in a reel-to-reel manufacturing process. A multi-foil manufacturing system (10) is schematically shown in FIG. 7. In this example the manufacturing system (10) comprises three units. The first unit is a foil feed (11), arranged to provide a foil (2) with at least one terminal (4). The second unit is an adhesive patterning unit (12), arranged to provide a pattern of through-holes (6) in a solid state adhesive layer (5). As described above, the patterning may be done before or after laminating the adhesive layer to the foils. The third unit is a filling unit (14), arranged to fill the through-holes (6) with a conductive material (7), so as to form a conductive structure (1) between two foils (2).

In another embodiment, the manufacturing system (10) further comprises an alignment unit, arranged to align the terminal (4) in the foil (2) and the through-holes (6) in the pre-patterned adhesive layer (5).

In yet another embodiment, the manufacturing system (10) further comprises a foil patterning unit, arranged to provide a pattern of through-holes (6) in a foil (2).

Examples of smart foil systems can be found in the prior art. Purely as an illustration of such systems, two examples are described here in some detail.

EXAMPLE 1

Smart Bandage Sensor

Figure 8:
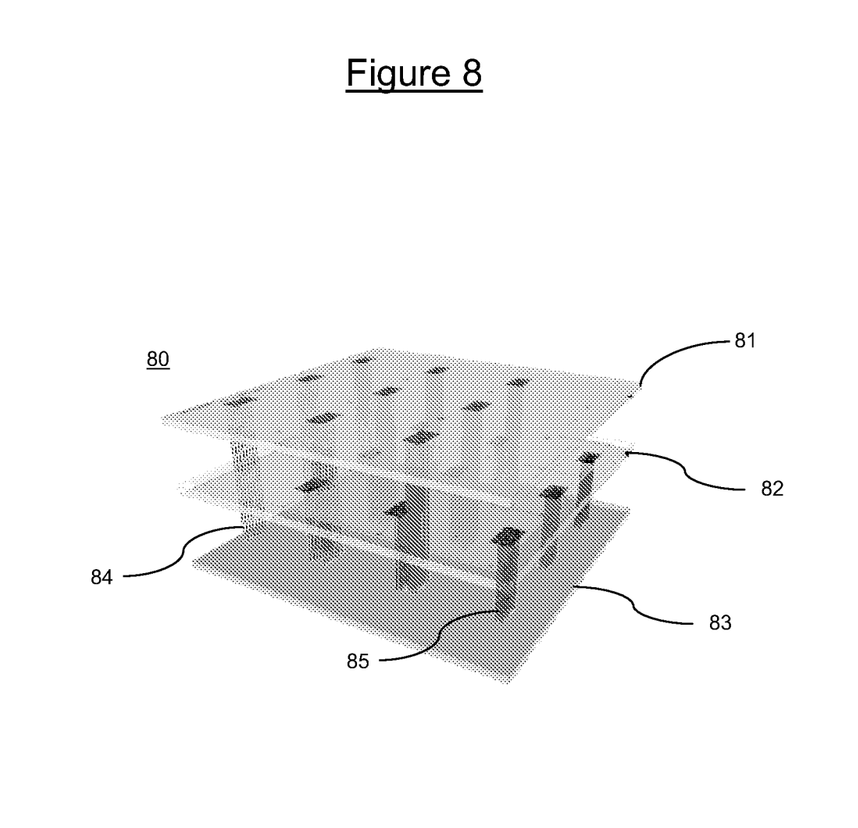
FIG. 8: Exemplary three-foil system forming a smart bandage sensor for in-situ monitoring of the healing of a wound.

An example of a multi-foil system is a smart bandage sensor for in-situ monitoring of the healing of a wound. FIG.

8 shows the smart bandage sensor 80 as a three-foil system comprising three functional foils 81, 82 and 83. The three foils 81, 82 and 83 are laminated and electrically interconnected via two layers of adhesive. The adhesive layers between the foils are not visible in FIG. 8. First foil 81 is an 'OLED foil' comprising a Polyethylene Naphthalate (PEN) layer with printed organic light emitting diodes (OLED's). To protect the OLED's against the ambient environment, the OLED's may be locally covered by flexible, inorganic transparent barrier layers. Second foil 82 is a Thotodiode foil' comprising a PEN layer with printed organic photodiodes. Like the OLED's, the photodiodes are also sensitive to environmental influences and the OLED layer may also be locally covered by flexible, inorganic transparent barrier layers. Third foil 83 is a 'Driver foil' onto which driver components are mounted. The driver foil comprises a copper layer and a polyimide layer. Both the OLED foil 81 and the Photodiode foil 82 are electrically connected to the Driver foil 83.

The internal structure of the foils and the inorganic layers that may be locally provided may result in different surface structures of the foils 81, 82 and 83. For this reason, the foils 81, 82 and 83 cannot be melted directly on top of each other. Instead, adhesive layers are inserted between the different foils 81, 82 and 83 to bond the different surface structures and to provide a buffer between the different surface structures. Electrical interconnects 84 and 85 are provided by making holes in the adhesive layer and filling the holes with conductive material.

In this example, first interconnects 84 connect OLED foil 81 to Driver foil 83 and second interconnects 85 connect Photodiode foil 82 to Driver foil 83. First interconnects 85 pass through Photodiode foil 82. In FIG. 8, it can be seen that the sensitivity of the Photodiode foil 82 with respect to providing holes results in the holes for the second interconnects to pass through foil 82 in specific areas only, more specifically areas apart from the internal functional circuits of the foil. Holes outside these areas could easily damage the foil.

In this example, optical diffuser material is added to the adhesive layer provided between the OLED foil 81 and the Photodiode foil 82 to ensure a good incoupling of the light from the OLED foil 81 onto the Photodiode foil 82.

EXAMPLE 2

Laminated OLED

Another example of a multi-foil system is a two-foil laminated OLED, wherein a power distribution foil is laminated to an OLED foil using an adhesive layer. The power distribution foil supports the current distribution across the poorly conducting anode of the OLED. This configuration enables the manufacturing of very large sized OLED's which still give a homogeneous light output. In this example, the adhesive layer allows connecting the dissimilar surface structures of the OLED foil and the power distribution foil. Furthermore, the adhesive layer gives the device its mechanical integrity. Without the adhesive layer, the device would fall apart. In this example, water getters are mixed into the adhesive film to keep water away from the water-sensitive OLED's and to increase the lifetime of the OLED's.

The detailed drawings, specific examples and particular formulations given, serve the purpose of illustration only. In the embodiments described, the conductive structures (1) form electrical interconnects between terminals (4) in foils (2). It is however also possible to create a conductive structure (1) connected to one terminal (4) only, or to form a conductive wire grid for connecting terminals (4) within the same foil (2). Furthermore, other substitutions, modifications, changes, and omissions may be made in the design, operating conditions, and arrangement of the exemplary embodiments without departing from the scope of the invention as expressed in the appended claims.

The invention claimed is:

1. A method of providing conductive structures between a first functional foil and a second functional foil in a multi-functional foil system that is flexible in finished form, wherein the first functional foil comprises a first terminal and a first functional circuit connected to the first terminal, the method comprising the steps of:
    providing a solid state adhesive layer on the first functional foil;
    patterning the solid state adhesive layer with through-holes without patterning the first functional foil;
    filling the through-holes with a conductive material; and
    bonding, after the filling, the solid state adhesive layer to the second functional foil so as to mechanically and electronically connect the first functional foil and the second functional foil,
    wherein the through-holes comprise a first through-hole to the first terminal,
    wherein, during the filling, the conductive material fills the first through-hole to form a first conductive structure connected to the first terminal,
    wherein, after the bonding, the first conductive structure forms a conductive connection between the first terminal and the second functional foil,
    wherein the first functional foil and the second functional foil each comprises one or more components taken from the group consisting of: electronic components and optic components,
    wherein a first type of function performed by the first functional foil differs from a second type of function performed by the second functional foil,
    wherein a light emitting diode function type is carried out by either the first functional foil or the second functional foil that is not carried out by an other one of the first functional foil and the second functional foil, and
    wherein the two different function types are an organic light emitting diode and a photodiode.

2. The method of claim 1, further comprising patterning functional foil though-holes in at least one of the group consisting of: the first functional foil and the second functional foil.

3. The method of claim 2, wherein the patterning functional foil though-holes at least partly overlaps the patterning the solid state adhesive layer.

4. The method of claim 1, wherein a release liner is laminated to the adhesive layer, and
    wherein the method further comprises removing the release liner, after the filling the through-holes and before the bonding, so as to remove an excess of conductive material.

5. The method of claim 1, wherein each of the first functional foil, second functional foil, and the solid state adhesive are provided from a respective feed, and wherein the method further comprises aligning each respective feed with regard to the first terminal and the first through-hole, so as to be used in a reel-to-reel manufacturing process.

6. The method of claim 1 wherein the patterning the solid state adhesive layer exposes the first terminal on the first functional foil to form a conductive contact for connection with the first conductive structure during the filling.

7. The method of claim 1, wherein the patterning is performed while the solid state adhesive layer is on the first functional foil.

8. The method of claim 1, wherein the solid state adhesive layer comprises an additive that enhances a functionality of the adhesive layer.

9. The method of claim 8, wherein the additive is a water getter.

10. A method of providing conductive structures between a first functional foil and a second functional foil in a multi-functional foil system that is flexible in finished form, wherein the first functional foil comprises a first terminal and a first functional circuit connected to the first terminal, the method comprising the steps of:
   providing a solid states adhesive layer on the first functional foil;
   patterning the solid state adhesive layer with through-holes without patterning the first functional foil;
   filling the through-holes with a conductive material; and
   bonding, after the filling, the solid state adhesive layer to the second functional foil so as to mechanically and electronically connect the first functional foil and the second functional foil,
   wherein the through-holes comprise a first through-hole to the first terminal,
   wherein, during the filling, the conductive material fills the through-hole to form a first conductive structure connected to the first terminal,
   wherein, after the bonding, the first conductive structure forms a conductive connection between the first terminal and the second functional foil,
   wherein the first functional foil and the second functional foil each comprises one or more components taken from the group consisting of: electronic components and optic components,
   wherein a first type of function performed by the first functional foil differs from a second type of functional performed by the second functional foil,
   wherein a light emitting diode functional type is carried out by either the first functional foil or the second functional foil that is not carried out by an other one of the first functional foil and the second functional foil,
   wherein the solid states adhesive layer comprises an additive that enhances a functionality of the adhesive layer and
   wherein the additive is an optical diffuser material that improves a light guiding characteristic of the solid state adhesive layer.

11. A multifunctional multi-foil device that is flexible in finished form, the device comprising:
   a first functional foil, wherein the first functional foil comprises a first terminal and a first functional circuit connected to the first terminal;
   a second functional foil;
   conductive structures formed between the first functional foil and the second functional foil;
   a solid state adhesive layer on the first functional foil, wherein the solid state adhesive layer is patterned with through-holes without corresponding patterning of the first functional foil;
   a conductive material filling the though-holes; and
   wherein the solid state adhesive layer is bonded to the second functional foil so as to mechanically and electronically connect the first functional foil and the second functional foil,
   wherein the through-holes comprise a first through-hole to the first terminal,
   wherein the conductive material fills the first through-hole to form a first conductive structure connected to the first terminal,
   wherein the first conductive structure forms a conductive connection between the first terminal and the second functional foil,
   wherein the first functional foil and the second functional foil each comprises one or more components taken from the group consisting of: electronic components and optic components,
   wherein a first type of function performed by the first functional foil differs from a second type of function performed by the second functional foil,
   wherein a light emitting diode function type is carried out by either the first functional foil or the second functional foil that is not carried out by an other one of the first functional foil and the second functional foil, and
   wherein the two different function types are an organic light emitting diode and a photodiode.

12. The device of claim 11, wherein at least one of the first functional foil and the second functional foil is patterned with though-holes.

13. The device of claim 12 wherein the functional foil though-hole pattern at least partly overlaps the solid state adhesive layer through-hole pattern.

14. The device of claim 11, wherein the solid state adhesive layer comprises an additive that enhances a functionality of the adhesive layer.

15. The device of claim 14, wherein the additive is an optical diffuser material that improves a light guiding characteristic of the solid state adhesive layer.

16. The device of claim 14, wherein the additive is a water getter.

* * * * *